(12) United States Patent
Shimmura (10) Patent No.: US 10,379,441 B2
(45) Date of Patent: Aug. 13, 2019

(54) LIQUID PROCESSING APPARATUS

(71) Applicant: TOKYO ELECTRON LIMITED, Tokyo (JP)

(72) Inventor: Satoshi Shimmura, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/015,712

(22) Filed: Jun. 22, 2018

(65) Prior Publication Data

US 2018/0373151 A1    Dec. 27, 2018

(30) Foreign Application Priority Data

Jun. 23, 2017 (JP) ................. 2017-123312

(51) Int. Cl.
```
G03F 7/16      (2006.01)
H01L 21/67     (2006.01)
B05C 11/08     (2006.01)
```
(52) U.S. Cl.
CPC .............. *G03F 7/162* (2013.01); *B05C 11/08* (2013.01); *H01L 21/6715* (2013.01); *H01L 21/67017* (2013.01)

(58) Field of Classification Search
None
See application file for complete search history.

(56) References Cited

U.S. PATENT DOCUMENTS

| | | | | |
|---|---|---|---|---|
| 5,769,945 A * | 6/1998 | Davis | ............... | B05C 11/08 118/319 |
| 5,861,061 A * | 1/1999 | Hayes | ............... | G03F 7/162 118/319 |
| 5,985,031 A * | 11/1999 | Davis | ............... | G03F 7/162 118/500 |
| 6,140,253 A * | 10/2000 | Hayes | ............... | H01L 21/67075 118/52 |
| 7,604,832 B2 * | 10/2009 | Ito | ............... | H01L 21/02126 118/320 |
| 2002/0029852 A1 * | 3/2002 | Egashira | ............... | H01L 21/67313 156/345.12 |
| 2013/0189852 A1 * | 7/2013 | Yoshihara | ............... | H01L 21/67 438/778 |

FOREIGN PATENT DOCUMENTS

JP    2004-50054 A    2/2004
JP    2004-305966 A    11/2004

* cited by examiner

*Primary Examiner* — Jethro M. Pence
(74) *Attorney, Agent, or Firm* — Nath, Goldberg & Meyer; Jerald L. Meyer (57) ABSTRACT

A liquid processing apparatus includes a substrate holding part, a processing liquid supply part configured to supply a processing liquid to the substrate, a cup body provided to surround the substrate and configured to drain the processing liquid scattered by the rotation of the substrate, a solvent supply part configured to supply a solvent for dissolving a solid component generated from the processing liquid, an exhaust path member having an exhaust port opened inside the cup body, and configured to exhaust an atmosphere around the substrate, and a liquid diffusion part having a concavo-convex pattern and provided on an inner surface of an exhaust path so that the solvent is spread by a capillary phenomenon inside the exhaust path through which the atmosphere is exhausted. The exhaust path is formed inside the cup body and the exhaust path member.

9 Claims, 12 Drawing Sheets

LIQUID PROCESSING APPARATUS

CROSS-REFERENCE TO RELATED APPLICATION

This application is based upon and claims the benefit of priority from Japanese Patent Application No. 2017-123312, filed on Jun. 23, 2017, the entire contents of which are incorporated herein by reference.

TECHNICAL FIELD

The present disclosure relates to a technique for removing a solid component precipitated from a processing liquid when a process is performed by supplying the processing liquid to a substrate and rotating the substrate.

BACKGROUND

In a photoresist process, which is one of the semiconductor manufacturing processes, a coating process is carried out in which a coating liquid such as a resist or the like is coated on the surface of a semiconductor wafer (hereinafter referred to as a "wafer"). For example, in a resist coating apparatus, a cup body is provided so as to surround the periphery of a spin chuck that holds a wafer. A coating liquid such as a resist liquid or the like is dropped onto the wafer on the spin chuck. The wafer is spun to form a coating film on the entire surface thereof. At this time, the coating liquid centrifugally separated from the wafer is received by the cup body and is drained from a drainage port provided under the cup body. Furthermore, the resist liquid centrifugally separated from the wafer becomes fine particles (mist). There is a possibility that the mist adheres to the wafer and contaminates the wafer. Therefore, an exhaust pipe is connected to the cup body, and the atmosphere around the wafer is exhausted to suppress contamination due to the mist. However, a solid component of the coating liquid scattered in the cup body may be scattered by the flow of an exhaust gas and may adhere to the inside of the cup body. When such a substance adheres to the inside of the cup body, problems such as fluctuation of an exhaust pressure and obstruction of drainage may occur.

In recent years, along with the high integration of a semiconductor circuit, a device having a more complicated three-dimensional structure has been studied. In the case of manufacturing such a device, from the viewpoint of increasing etching resistance, it is required to make a resist film thick, and it is necessary to use a resist liquid having a high viscosity of, for example, 200 cP or more. In such a material with high viscosity, the content of a solid component in a coating liquid is large and the solid component is easily precipitated, which requires high frequency maintenance. There is known a technique of radially supplying a solvent into a cup body together with an air flow to remove an adhered substance inside the cup body. When the solvent is supplied into the cup body, a part to which the solvent is hardly supplied may be present. This may make it difficult to sufficiently remove the adhered substance.

Since the atmosphere in the cup body is also exhausted, the adhered substance may be wound up by an exhaust gas and may enter and adhere to an exhaust path. Therefore, it is also necessary to remove an adhered substance in the exhaust path. For example, there is known a technique of providing a solvent supply nozzle in an exhaust path and removing an adhered substance flowing into and adhering to an exhaust path. However, there is a need for a technique of more efficiently removing an adhered substance.

SUMMARY

Some embodiments of the present disclosure provide a technique for removing a solid component adhering to the inside of a liquid processing apparatus in which an atmosphere around a substrate is exhausted and a processing liquid centrifugally separated from the substrate is drained, when a process is performed by supplying the processing liquid to the substrate and rotating the substrate.

According to one embodiment of the present disclosure, there is provided a liquid processing apparatus, including: a substrate holding part configured to hold a substrate horizontally and rotate the substrate around a vertical axis; a processing liquid supply part configured to supply a processing liquid to the substrate held by the substrate holding part; a cup body provided so as to surround the substrate on the substrate holding part and configured to drain the processing liquid scattered by the rotation of the substrate; a solvent supply part configured to supply a solvent for dissolving a solid component generated from the processing liquid; an exhaust path member having an exhaust port opened inside the cup body, and configured to exhaust an atmosphere around the substrate held by the substrate holding part through the cup body; and a liquid diffusion part having a concavo-convex pattern and provided on an inner surface of an exhaust path so that the solvent supplied from the solvent supply part is spread by a capillary phenomenon inside the exhaust path through which the atmosphere around the substrate is exhausted, the exhaust path being formed inside the cup body and the exhaust path member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
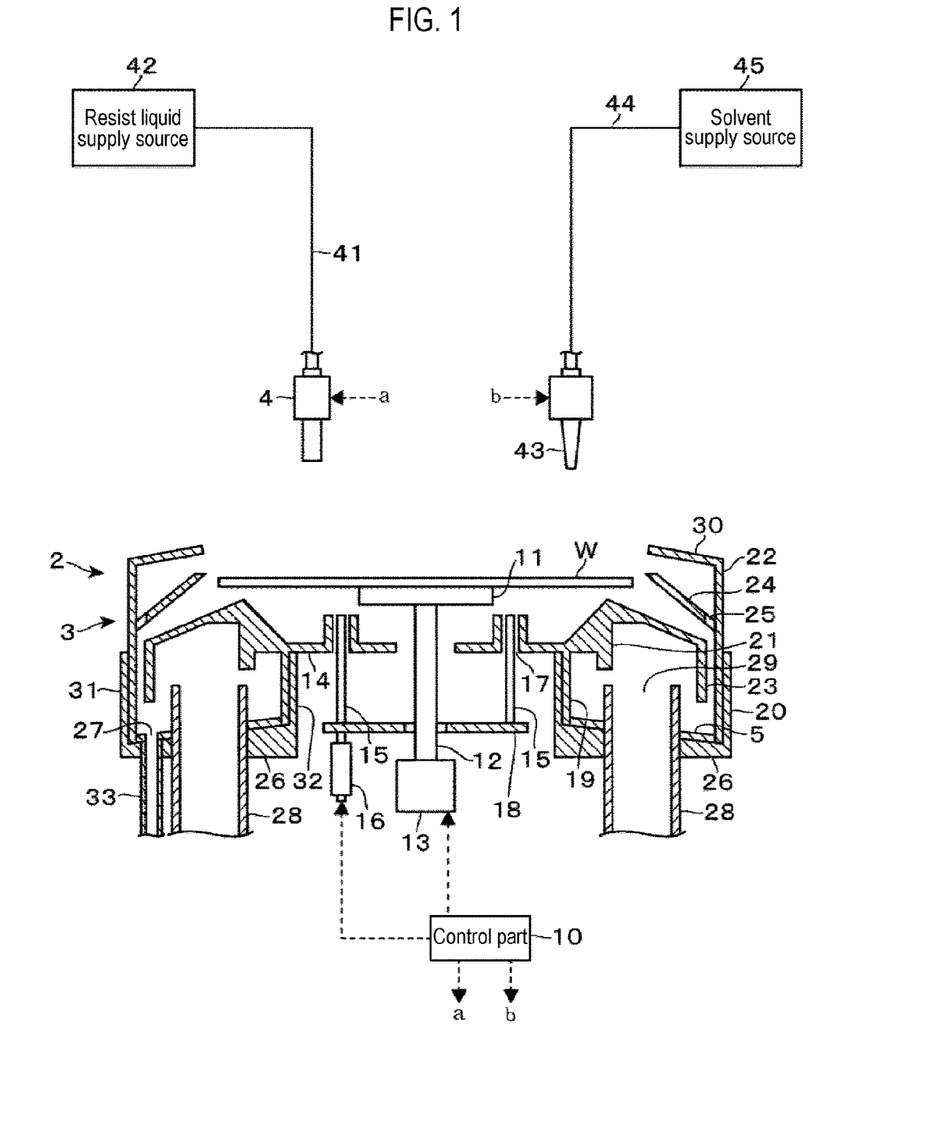
FIG. 1 is a vertical sectional view showing a resist coating apparatus.

An embodiment, in which a liquid processing apparatus according to an embodiment of the present disclosure is applied to a resist coating apparatus for coating a resist liquid as a coating liquid on a wafer W by spin coating, will be described. As shown in FIG. 1, the resist coating apparatus according to the present embodiment includes a spin chuck 11 which is a substrate holding part that holds the wafer W horizontally by vacuum-chucking the central portion of the back surface of the wafer W. The spin chuck 11 is connected to a rotation mechanism 13 from below via a shaft portion 12 and is rotated about a vertical axis by the rotation mechanism 13.

On the lower side of the spin chuck 11, a circular plate 14 is provided so as to surround the shaft portion 12 with a gap. Three through holes 17 are formed in the circular plate 14 along the circumferential direction, and lift pins 15 are provided in the respective through holes 17. A common elevating plate 18 is provided below the lift pins 15. The lift pins 15 are configured to be moved up and down by an elevating mechanism 16 provided below the elevating plate 18.

In addition, the resist coating apparatus includes a resist liquid nozzle 4 for supplying a resist liquid to the wafer W. The resist liquid nozzle 4 is connected to a resist liquid supply source 42 via a resist liquid supply pipe 41. In addition, the resist coating apparatus includes a solvent nozzle 43 for supplying a solvent for diluting the resist liquid, for example, cyclohexanone (CHN), to the wafer W. The solvent nozzle 43 is connected to a solvent supply source 45 via a solvent supply pipe 44.

Further, a cup body 2 is provided so as to surround the spin chuck 11. The cup body 2 is configured to receive a scattered liquid or a liquid falling from the rotating wafer W and to discharge the liquid to the outside of the resist coating apparatus. The cup body 2 includes a mountain-shaped guide portion 21 provided around a circular plate 14 in a ring shape having a mountain-like cross-section. An annular current regulating plate 23 is provided so as to extend downward from the outer peripheral end of the mountain-shaped guide portion 21. An annular vertical wall 19 serving as an inner peripheral wall of the cup body 2 is provided in the region of the lower surface of the mountain-shaped guide portion 21, which is positioned more inward than the current regulating plate 23. The mountain-shaped guide portion 21 guides the liquid falling from the wafer W to the outer lower side of the wafer W.

In addition, an upper cup body 3 is provided so as to surround the outer side of the mountain-shaped guide portion 21. The upper cup body 3 includes a vertical cylindrical portion 22. An upper guide portion 24 extending obliquely inward and upward is provided on the inner surface of the cylindrical portion 22. The upper guide portion 24 is provided with a plurality of openings 25 disposed along the circumferential direction. An inclined wall 30 is provided so as to extend inward and upward from the upper edge of the cylindrical portion 22. Further, the cup body 2 includes a liquid receiving part 20 disposed below the mountain-shaped guide portion 21 and the current regulating plate 23 and configured to receive the resist liquid and the solvent flowing along the mountain-shaped guide portion 21 and the current regulating plate 23.

The configuration of the liquid receiving part 20 will also be described with reference to FIGS. 2 and 3. The liquid receiving part 20 is made of, for example, stainless steel (SUS), and is formed in a ring shape having a concave cross-section surrounded by an annular inner wall 32 and an annular outer wall 31. A drainage port 27 is opened in a bottom surface 26 of the liquid receiving part 20 on the outer peripheral side of the current regulating plate 23, and one end of a drainage pipe 33 is connected to the drainage port 27. On the inner peripheral side of the current regulating plate 23 in the liquid receiving part 20, two exhaust pipes 28 arranged so as to sandwich the central portion of the liquid receiving part 20 are provided so as to penetrate the bottom surface 26 of the liquid receiving part 20. The openings 29 of the exhaust pipes 28 are opened at a position higher than the bottom surface 26 of the liquid receiving part 20. As shown in FIG. 1, the liquid receiving part 20 is disposed so that the annular inner wall 32 is inserted into the inside of the vertical wall 19 of the mountain-shaped guide portion 21, and the annular outer wall 31 surrounds the cylindrical portion 22 of the upper cup body 3.

Figure 2:
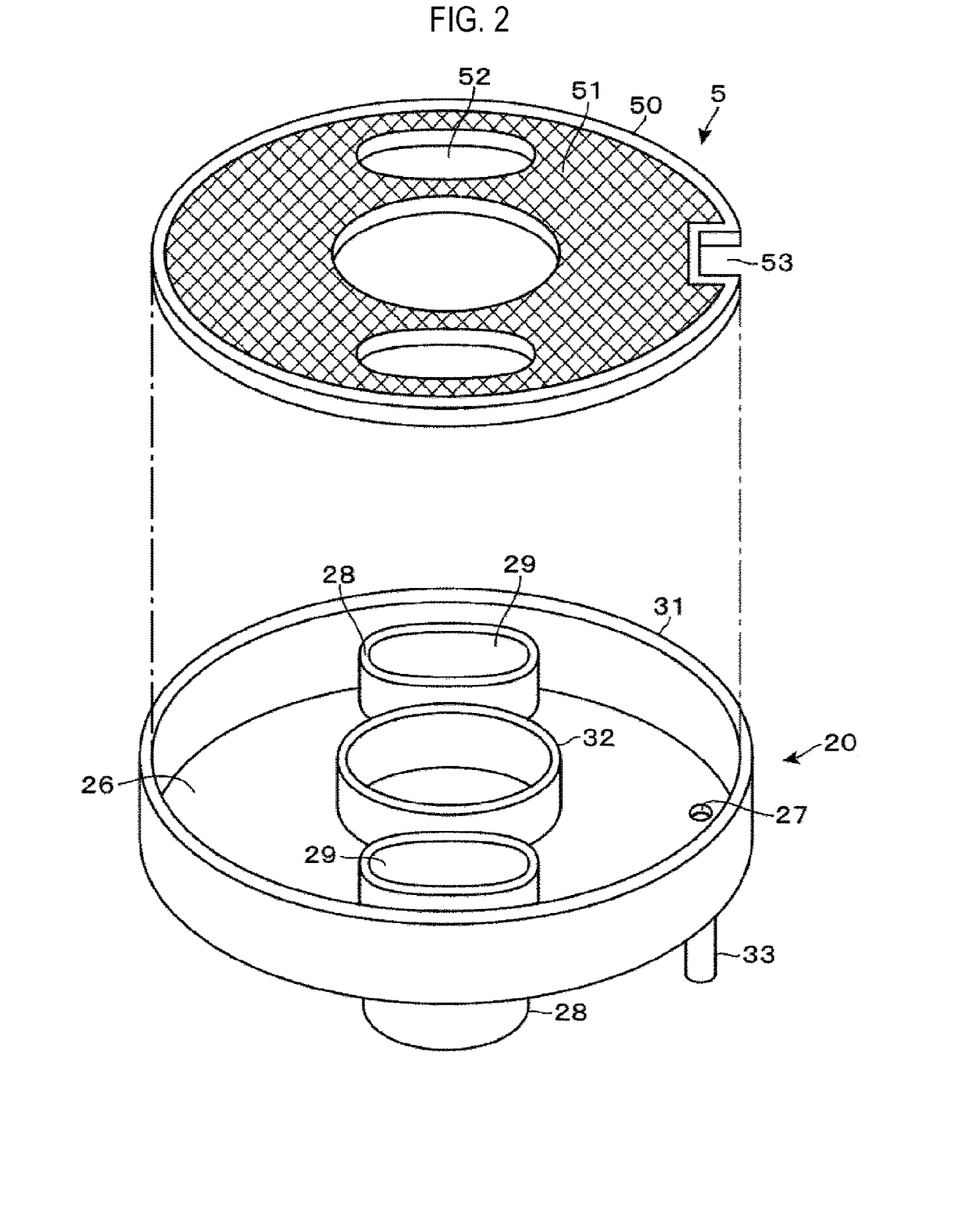
FIG. 2 is an exploded perspective view showing a liquid receiving part.
Figure 3:
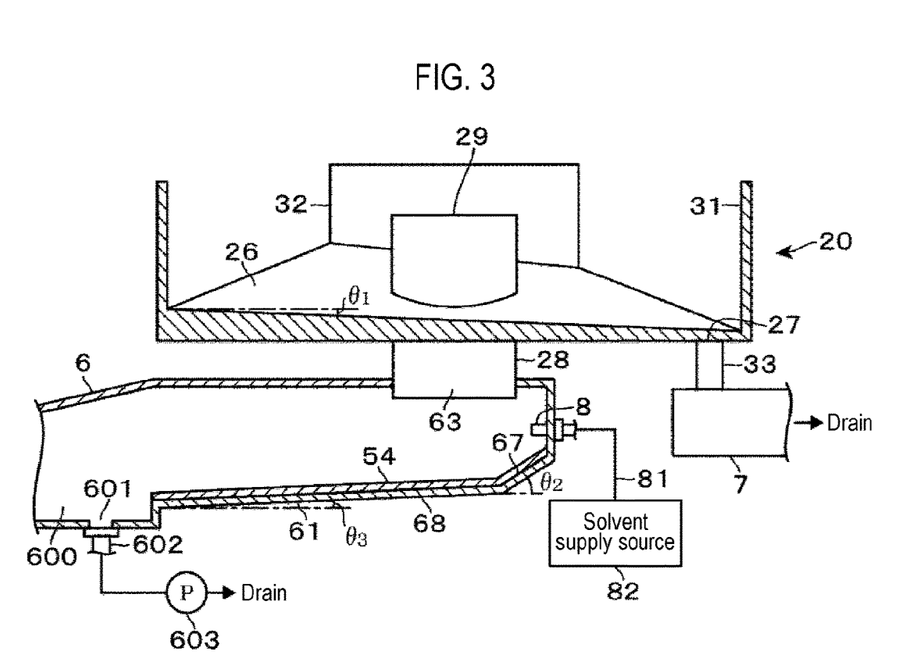
FIG. 3 is a vertical sectional view of an exhaust duct.

As shown in FIG. 3, the bottom surface 26 of the liquid receiving part 20 is inclined from the center side to the peripheral edge side and is formed of a slant surface inclined at an inclination angle θ1 with respect to the horizontal plane, when viewed in the radial direction passing through the drainage port 27 and the center of the liquid receiving part 20, so that the side of the drainage port 27 is low. Accordingly, the processing liquid flowing down to the bottom surface of the liquid receiving part 20 flows from the center side of the liquid receiving part 20 toward the peripheral edge side and flows toward the drainage port 27. As shown in FIGS. 1 and 2, on the bottom surface 26 of the liquid receiving part 20, there is provided a liquid diffusion part 5 for expanding a solvent flow path on the bottom surface 26 of the liquid receiving part 20 until the solvent is drained to the drainage port 27. The solvent spreads by a capillary phenomenon as described later in the liquid diffusion part 5. Therefore, it can be seen that a force keeping the solvent in the liquid diffusion part 5 by surface tension is exerted on the solvent. Therefore, the flow velocity of the solvent is caused to slow down in the liquid diffusion part 5, compared with a case before the liquid diffusion part 5 is provided. Accordingly, it can be said that the liquid diffusion part 5 also has a function of lengthening the staying time of the solvent.

As shown in FIG. 2, the liquid diffusion part 5 is, for example, a planar body provided over the entire bottom surface 26 of the liquid receiving part 20. The liquid diffusion part 5 is detachably attached to the bottom surface 26 of the liquid receiving part 20. Accordingly, in the liquid diffusion part 5, inclination is formed in conformity with the inclination of the bottom surface 26 of the liquid receiving part 20. In FIG. 2, in order to avoid complication of description, the bottom surface of the liquid receiving part 20 is shown as a flat surface, and the liquid diffusion part 5 is shown in a flat plate shape. In addition, in FIG. 3, in order to avoid complication of the description, the illustration of the liquid diffusion part 5 in the liquid receiving part 20 is omitted.

The liquid diffusion part 5 is configured to have a thickness of 1 mm, and includes, for example, a frame portion 50 provided along the peripheral edge of the bottom surface 26 and a mesh 51 provided inside the frame portion 50. The mesh 51 is formed by a wire having a wire diameter of, for example, 0.22 mm, so as to have an opening size of 0.5 mm (in the specification of this application, the liquid diffusion part 5 whose inside is the mesh 51 is also a planar body). The liquid diffusion part 5 is formed in a substantially annular shape having approximately the same size as the bottom surface 26 of the liquid receiving part 20. Holes 52 are formed at the positions corresponding to the two exhaust pipes 28. A notch 53 is formed at the position corresponding to the drainage port 27. Accordingly, when the liquid diffusion part 5 is installed on the bottom surface 26, the corresponding exhaust pipes 28 are inserted into the respective holes 52, and the drainage port 27 is aligned with the notch 53.

Figure 4:
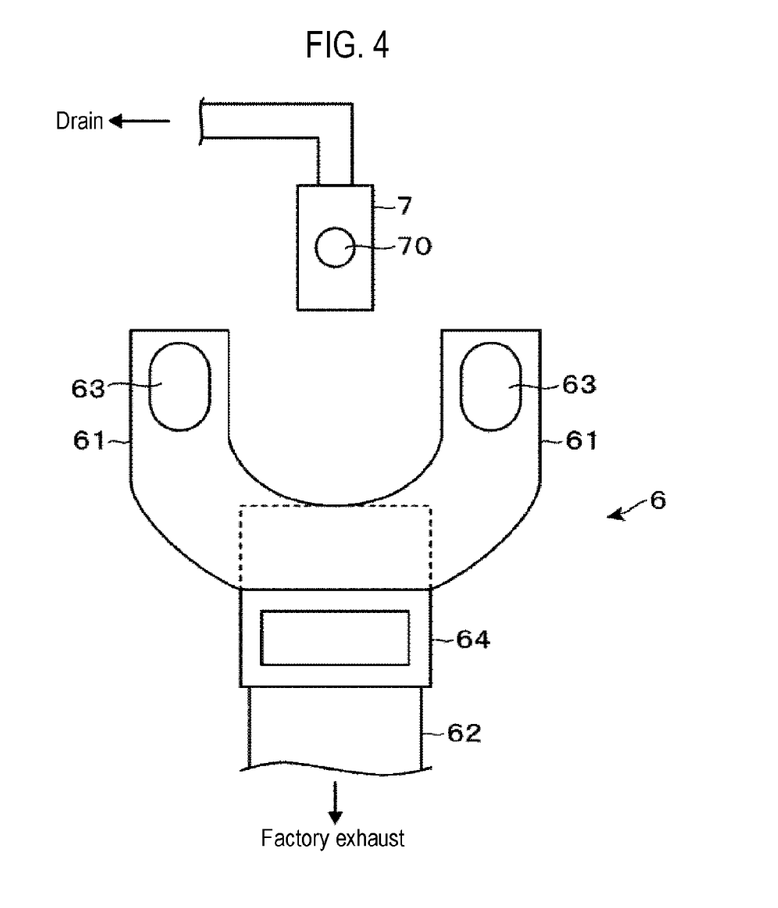
FIG. 4 is a plan view showing an exhaust duct and a drain path.

As shown in FIG. 3, an exhaust duct 6 and a drainage case 7 are provided below the liquid receiving part 20. The exhaust duct 6 is arranged so as to extend in the horizontal direction. As shown in FIG. 4, one end of the exhaust duct 6 is branched into branch ducts 61, and the other end of the exhaust duct 6 is a merging duct 62 connected to, for example, a factory exhaust. Openings 63 are formed on the upper surface side of the respective end portions of the branch ducts 61, and the lower end portions of the exhaust pipes 28 are connected to the respective openings 63 as shown in FIG. 3. The merging duct 62 is provided with an exhaust damper 64. The pressure inside the exhaust duct 6 and the exhaust pressure inside the cup body 2 can be adjusted by adjusting the opening degree of the exhaust damper 64. The exhaust duct 6 and the exhaust pipes 28 correspond to an exhaust path member.

By performing exhaust with the factory exhaust, the atmosphere inside the cup body 2 is exhausted through the inside of the merging duct 62, the branch ducts 61 and the exhaust pipes 28. In the interior of the cup body 2, the atmosphere around the wafer W held by the spin chuck 11 flows into the exhaust path along the circumferential direction of the cup body 2 between the upper guide portion 24 and the current regulating plate 23, flows along the bottom surface 26 of the liquid receiving part 20, and is exhausted from the opening portion 29 of the exhaust pipe 28. Therefore, a path flowing into the exhaust passage formed along the circumferential direction of the cup body 2 between the upper cup body 3 and the current regulating plate 23, flowing along the bottom surface of the liquid receiving part 20, and flowing through the opening 29 of the exhaust pipe 28 corresponds to an exhaust path inside the cup body 2. The interior of the merging duct 62, the branch duct 61 and the exhaust pipe 28 corresponds to an exhaust path inside the exhaust path member.

Figure 5:
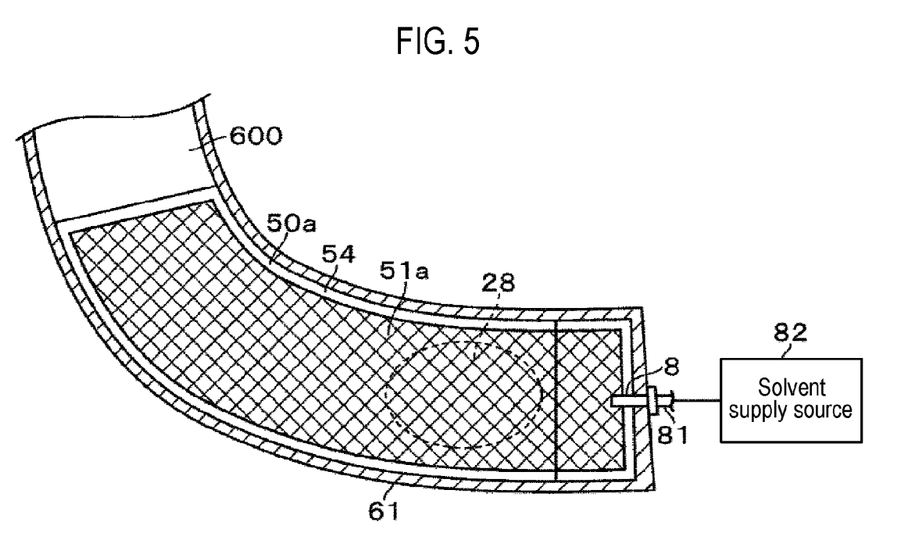
FIG. 5 is a horizontal sectional plan view of a branch duct.

As shown in FIGS. 3 and 5, a second solvent nozzle 8 for discharging, for example, CNH, is provided on the inner surface of a leading end of the branch ducts 61 in the direction in which the branch ducts 61 extend. One end of a solvent supply path 81 is connected to the second solvent nozzle 8, and a solvent supply source 82 that stores CHN is connected to the other end of the solvent supply path 81.

The bottom of the interior of the branch duct 61 is configured so that a first inclined portion 67 descending from the leading end of the branch duct 61 toward a base end and a second inclined portion 68, whose angle with respect to the horizontal plane is set at an angle θ3 gentler than the inclination angle θ2 of the first inclined portion 67, are continuous and so that the solvent discharged from the second solvent nozzle 8 flows toward the base end of the branch duct 61.

As shown in FIGS. 4 and 5, a solvent reservoir 600 into which the solvent discharged to the branch duct 61 flows is formed on the bottom surface of the exhaust duct 6 at the position where the branch ducts 61 are branched.

At the bottom of the solvent reservoir 600, a drainage port 601 is opened, and a drainage pipe 602 is connected to the drainage port 601. A drainage pump 603 is installed in the drainage pipe 602 and is configured such that the discharged liquid flowing into the solvent reservoir 600 is discharged through the drainage pipe 602.

As shown in FIGS. 3 and 5, a liquid diffusion part 54 is attached to the first inclined portion 67 and the second inclined portion 68 of the branch duct 61. Like the liquid diffusion part 5, the liquid diffusion part 54 is a planar body configured to conform to the shape of the inclined surfaces of the first inclined portion 67 and the second inclined portion 68. The liquid diffusion part 54 includes a frame portion 50a and a mesh 51a provided inside the frame portion 50a. The mesh 51a is configured to have the same wire diameter and opening size as the mesh 51 provided in the liquid diffusion part 5.

As shown in FIG. 4, the drainage case 7 has a hole 70 on the upper surface thereof. The drainage pipe 33 is connected to the hole 70. The drainage case 7 is configured to be capable of discharging the liquid introduced through the drainage pipe 33.

As shown in FIG. 1, the resist coating apparatus includes a control part 10. Programs stored in a storage medium such as a flexible disk, a compact disk, a hard disk, an MO (magneto-optical disk), a memory card or the like are installed in the control part 10. Instructions (steps) are incorporated in the installed program so as to transmit control signals to the respective parts of the resist coating apparatus to control the operation thereof.

The operation of the resist coating apparatus will be described. First, a wafer W as a substrate to be processed is placed on the spin chuck 11. Next, the wafer W is rotated, and the evacuation of the inside of the cup body 2 is started. A pre-wet process for supplying a solvent to the rotating wafer W and a resist coating process for supplying a resist liquid toward the central portion of the wafer W while adjusting the number of revolutions of the wafer W are performed. At this time, when the resist liquid supplied to the wafer W is centrifugally separated from the wafer W, the resist liquid is received by the cup body 2 and flows downward along the inner surface of the cylindrical portion 22. The resist liquid that has reached the bottom surface 26 of the liquid receiving part 20 flows along the inclination of the bottom surface 26 from the center side of the bottom surface 26 toward the peripheral edge. The resist liquid flows along the peripheral edge and flows into the drainage port 27. At this time, the solid component contained in the resist liquid spreads together with the exhaust gas into the cup body 2 to adhere and precipitate in the cup body 2. For this reason, for example, when the number of processed wafers W or the number of processed lots reaches a predetermined number, a cleaning process for the solid component of the resist liquid adhering to the inside of the cup body 2 is performed.

Figure 6:
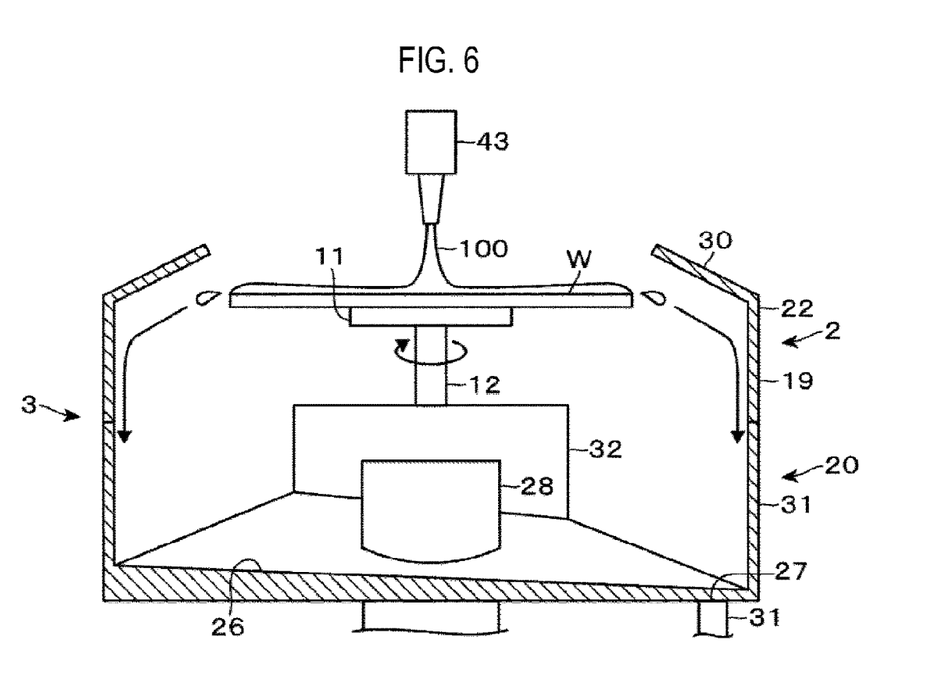
FIG. 6 is an explanatory view showing the action of the resist coating apparatus.

A cleaning process of the solid component of the resist liquid will be described. For example, when the number of processed wafers W, which are products, reaches a predetermined number, a cleaning process is performed using the wafer W. As the wafer W, for example, a cleaning-dedicated wafer is taken out by a transfer arm from a holding shelf provided in a liquid processing system in which the liquid processing apparatus is disposed. The cleaning-dedicated wafer is transported to the liquid processing apparatus. Alternatively, instead of using the cleaning-dedicated wafer W, the cleaning process may be performed by using, for example, a wafer W (a wafer W as a product) at the head of a lot subsequent to the wafer W at the time when the number of wafers W subjected to the liquid processing reaches a predetermined number. More specifically, the solvent nozzle 43 is moved to above the central portion of the wafer W while an unprocessed wafer W is placed on the spin chuck 11. Next, the wafer W is rotated, the evacuation of the inside of the cup body 2 is started, and the solvent 100 is supplied from the solvent nozzle 43 toward the wafer W. At this time, as shown in FIG. 6, the solvent 100 spreads on the surface of the wafer W and is centrifugally separated. In FIG. 6, the mountain-shaped guide portion 21 is omitted, and the upper cup body 3 is shown in a simplified manner.

Figure 7:
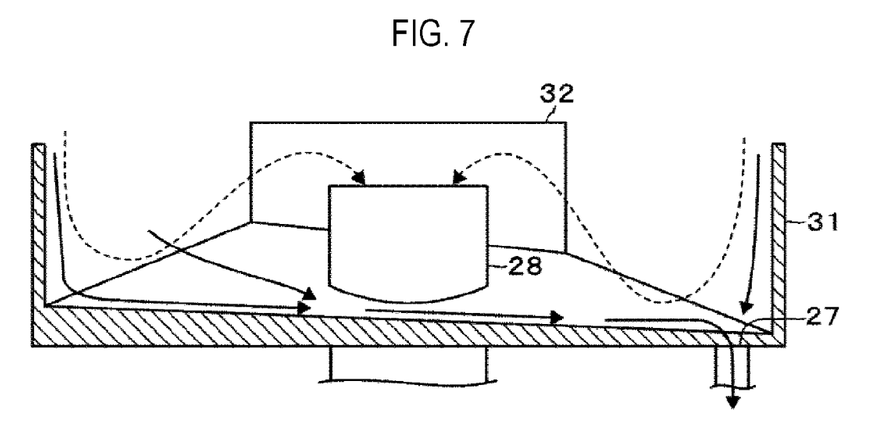
FIG. 7 is an explanatory view showing the action of the resist coating apparatus.

The solvent centrifugally separated from the wafer W is received by the cup body 2 and flows downward along the cylindrical portion 22. Then, as shown in FIG. 7, the solvent that has reached the bottom surface 26 of the liquid receiving part 20 flows along the bottom surface 26 of the liquid receiving part 20. At this time, the inside of the cup body 2 is evacuated. Therefore, in the liquid receiving part 20, an airflow flowing so as to go around the lower side of the current regulating plate 23 is formed as indicated by a broken line. Thus, the solvent 100 flows along the peripheral edge of the bottom surface of the liquid receiving part 20 and flows into the drainage port 27 while being moved by the airflow.

Figure 8:
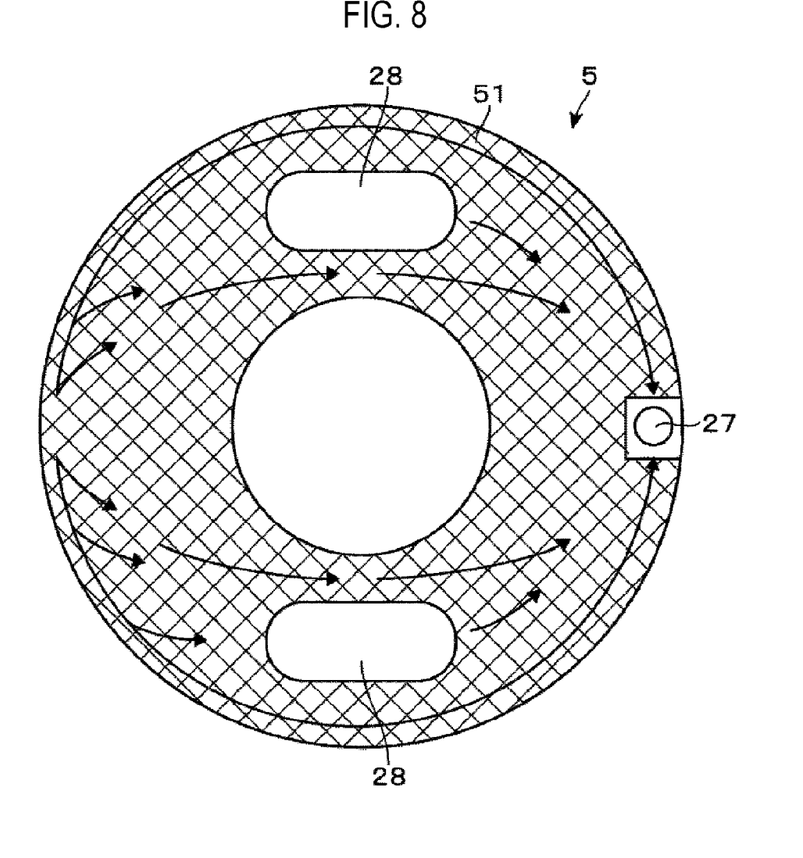
FIG. 8 is an explanatory view showing the action of the resist coating apparatus.
Figure 9:
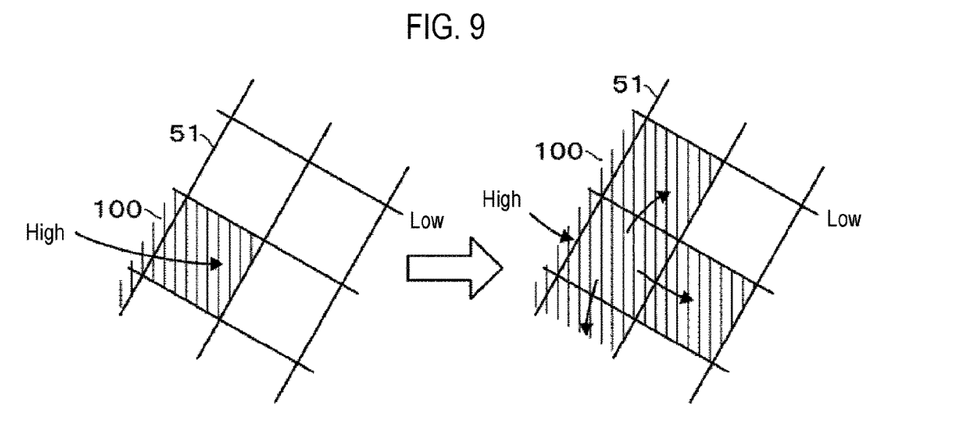
FIG. 9 is an explanatory view for explaining the expansion of a solvent flow path in a mesh.

At this time, the solvent 100 flowing along the bottom surface 26 of the liquid receiving part 20 flows in a lower direction along the inclined surface. As shown in FIG. 9, by entering the openings of the mesh 51, the solvent 100 flows so as to spread inside the openings of the mesh 51 due to surface tension. Further, a force of adsorbing the solvent 100 on the wire of the mesh 51 by surface tension is exerted on the solvent 100. Therefore, the solvent 100 flows from a higher position toward the openings of the mesh 51. When the solvent 100 overflows from the openings of the mesh 51, the solvent 100 tends to flow along the direction in which the wire of the mesh 51 extends. Therefore, the solvent 100 not only flows in the direction of low inclination and but also flows into the opening of the mesh 51 adjacent to the aforementioned opening of the mesh 51. When the solvent 100 flows into the opening of the adjacent mesh 51, the solvent 100 tends to spread in the opening of the mesh 51 due to surface tension. For this reason, the opening of the mesh 51 into which the solvent 100 flows tends to pull up the solvent on the upstream side due to a capillary phenomenon. Since the solvent 100 introduced from the upstream side tends to spread along the opening of the mesh 51 due to surface tension, as shown in FIG. 8, the solvent 100 flows toward the drainage port 27 while gradually expanding the flow area of the solvent 100.

In addition, the solvent 100 tends to flow along the inclination of the bottom surface 26 of the liquid receiving part 20. The mesh 51 has a large surface area and the surface tension exerted on the solvent 100 is large. Thus, a force of holding the solvent 100 inside the opening of the mesh 51 is exerted on the solvent 100. Therefore, the time taken from the time when the solvent 100 reaches the bottom surface of the liquid receiving part 20 to the time when the solvent 100 flows into the drainage port 27 is longer than in the case where the liquid diffusion part 5 is not provided. Otherwise, the solvent 100 is in a state where it remains inside the opening of the mesh 51.

In this way, the solvent 100 spreads widely on the bottom surface 26 of the liquid receiving part 20, and the time that the solvent 100 stays on the bottom surface 26 of the liquid receiving part 20 increases. As a result, the adhered substance such as the solid component of the resist liquid is exposed to the solvent 100 in a wide range on the bottom surface 26 of the liquid receiving part 20, and the time of exposure of the adhered substance to the solvent is prolonged. Accordingly, the adhered substance such as the solid component of the resist liquid adhering to the bottom surface 26 of the liquid receiving part 20 is efficiently dissolved and removed.

As described in the background, when the resist liquid flows in the cup body 2, the solid component in the resist liquid may be scattered by the exhaust gas flow in the cup body 2 and may enter the exhaust pipes 28. The solid component of the resist liquid may adhere to the inside of the exhaust duct 6. Further, the mist generated as the resist liquid centrifugally separated from the wafer W collides against the cup body 2 may flow into the exhaust pipes 28 together with the exhaust gas. The mist may adhere to the inside of the exhaust duct 6 and may be solidified. Therefore, when the number of processed wafers W or the number of processed lots reaches a predetermined number, maintenance of the inside of the exhaust duct 6 is performed to remove the solid component adhering to the exhaust duct 6.

Figure 10:
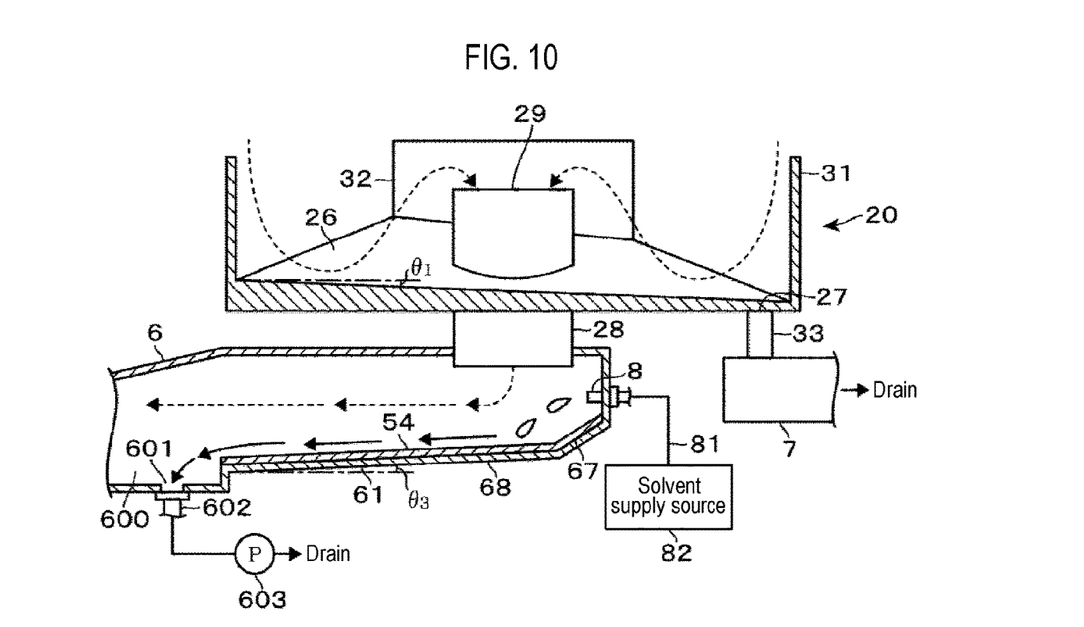
FIG. 10 is an explanatory view for explaining the removal of an adhered substance in an exhaust duct.

For example, when the processing of a predetermined number of wafers W is completed, as shown in FIG. 10, the drainage pump 603 is activated and the solvent is discharged from the second solvent nozzle 8. The solvent discharged from the second solvent nozzle 8 flows along the exhaust duct 6. Since the liquid diffusion part 54 is provided on the bottom surface of the branch duct 61 on the upstream side of the exhaust duct 6, the solvent flows while widening the flow path width and is retained in the mesh 51a of the liquid diffusion part 54 by surface tension. Accordingly, the solvent flows widely through the first inclined portion 67 and the second inclined portion 68 of the branch duct 61, whereby the time during which the solvent stays in the first inclined portion 67 and the second inclined portion 68 becomes longer. Therefore, the solvent is easily supplied to the solid component adhering to the inside of the branch duct 61, and the time during which the solid component makes contact with the solvent is prolonged. As a result, it is possible to remove the solid component more efficiently even in the exhaust duct 6.

According to the above-described embodiment, in the resist coating apparatus in which the resist liquid is supplied to the rotating wafer W to perform the processing, the liquid diffusion part 5 having a concavo-convex pattern is provided on the inner bottom surface of the cup body 2 for allowing the resist liquid scattered due to the rotation of the wafer W to flow to the bottom surface to drain the same. Therefore, when the solvent for dissolving the solid component of the processing liquid is supplied to the liquid diffusion part 5, the area of the solvent flow region is broadened, and the staying time during which the solvent stays is prolonged. Accordingly, the solid component of the resist liquid adhering to the inside of the cup body 2 is easily brought into contact with the solvent and, therefore, is easily dissolved and removed.

Furthermore, the second solvent nozzle 8 for discharging the solvent is provided inside the exhaust duct 6, and the liquid diffusion part 54 is provided on the bottom surface of the region of the exhaust duct 6 where the solvent discharged from the second solvent nozzle 8 flows. Therefore, when the adhered substance inside the exhaust duct 6 is removed by discharging the solvent from the second solvent nozzle 8, it is possible to widen the flow path of the solvent flowing through the exhaust duct 6, and it is possible to lengthen the time during which the solvent stays on the inner surface of the exhaust duct 6. This makes it possible to improve the removal efficiency of the adhered substance adhering to the inside of the exhaust duct 6.

Further, the liquid diffusion parts 5 and 54 are installed on the bottom surface 26 of the liquid receiving part 20 and the inclined surface inside the exhaust duct 6. If the surface along which the solvent or the coating liquid centrifugally separated from the wafer W flows is formed as an inclined surface, the discharged liquid is reliably guided to the drainage ports 27 and 601. However, the solvent tends to flow easily and the staying time is shortened, making it difficult to remove the precipitated solid component of the coating solution. In the above-described embodiment, by providing the liquid diffusion parts 5 and 54 on the inclined surface along which the discharged liquid flows, it is possible to allow the discharged liquid to reliably flow toward the drainage ports 27 and 601, to prolong the staying time of the solvent on the inclined surface, and to efficiently remove the precipitated solid component.

Figure 11:
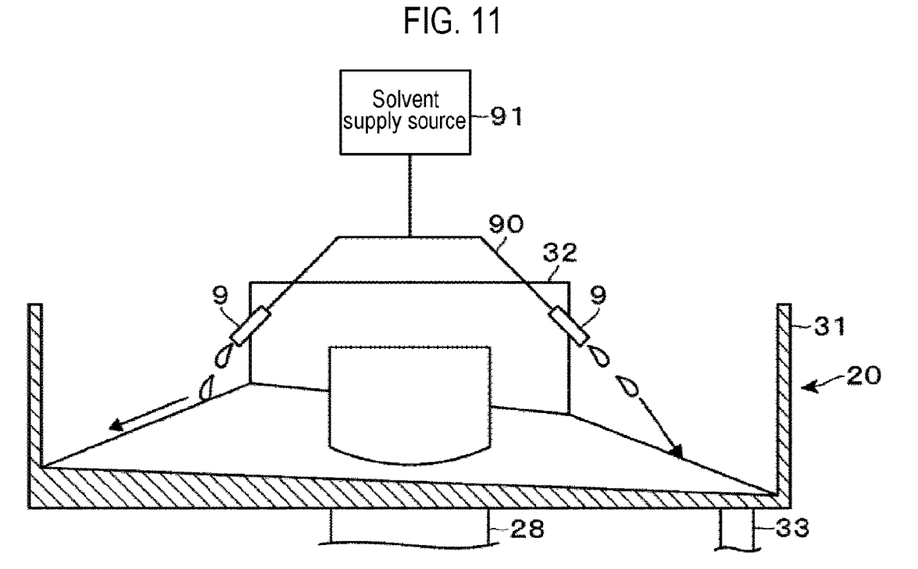
FIG. 11 is a vertical sectional view showing another example of the liquid processing apparatus.

In the present disclosure, in addition to the solvent nozzle 43 that discharges the solvent to the wafer W, a solvent discharge nozzle for discharging the solvent toward the liquid diffusion part 5 may be provided inside the cup body. In the above-described embodiment, the bottom surface 26 of the liquid receiving part 20 is inclined from the center side to the peripheral edge side. Therefore, the solvent tends to easily flow to the peripheral edge side of the bottom surface 26 of the liquid receiving part 20. Accordingly, for example, as shown in FIG. 11, there is provided an auxiliary nozzle 9 for discharging a solvent toward the center region of the bottom surface 26 of the liquid receiving part 20. In FIG. 11, reference numeral 90 denotes a solvent supply path for supplying a solvent to the auxiliary nozzle 9, and reference numeral 91 denotes a solvent supply source. Then, for example, a solvent is supplied toward the rotating wafer W, and a solvent is discharged from the auxiliary nozzle 9 toward the center region of the bottom surface of the liquid receiving part 20. As a result, the supply amount of the solvent in the center side region of the bottom surface of the liquid receiving part 20 increases. This makes it possible to remove an adhered substance more efficiently.

Further, the liquid diffusion part 5 may be provided at a portion to which a solid component adheres. Specifically, by driving the liquid processing apparatus in advance, it may be possible to grasp a portion to which a solid component adheres, in the cup body 2 or in the exhaust duct 6. The liquid diffusion part 5 may be provided at the portion thus grasped. At this time, for example, when providing the liquid diffusion part 5 on the bottom surface 26 of the liquid receiving part 20, it is possible to obtain an effect if the liquid diffusion part 5 is provided so as to cover the bottom surface 26 of the liquid receiving part 20 by an area ratio of 80% or more.

In addition, for example, a mesh 51 formed in a rectangular shape may be provided so as to spread over the portion to which the solid component adheres, for example, the bottom surface 26 of the liquid receiving part 20. With such a configuration, the liquid diffusion part 5 can be formed with ease.

Further, the liquid diffusion part 5 may be an uneven region formed by roughening the bottom surface of the liquid receiving part 20 or the bottom surface of the exhaust duct 6. As such an example, there is an example in which concavo-convex processing is performed by sandblasting the inner bottom surface 26 of the liquid receiving part 20. By forming the bottom surface 26 of the liquid receiving part 20 into an uneven surface, the surface area of the bottom surface 26 increases and the surface tension acting on the solvent flowing along the bottom surface 26 also increases. Therefore, the flow path of the solvent can be easily widened and the staying time of the solvent can be prolonged, so that the same effect can be obtained.

Alternatively, a plurality of grooves (linear irregularities) arranged concentrically around the central portion of the liquid receiving part 20 may be formed on the bottom surface 26 of the liquid receiving part 20. By forming the grooves on the bottom surface 26 of the liquid receiving part 20, the solvent enters the grooves so that the flow path is widened by a capillary phenomenon. The time during which the solvent stays on the bottom surface 26 of the liquid receiving part 20 can be prolonged by the grooves. Thus, the same effect can be obtained.

In the above-described embodiment, the liquid diffusion parts 5 and 54 are configured to be detachable from the bottom surface 26 of the liquid receiving part 20 and the inclined surface inside the exhaust duct 6, respectively. Therefore, the liquid diffusion parts 5 and 54 can be easily replaced. This provides an effect that the maintenance of the apparatus is simplified.

Since the liquid diffusion parts 5 and 54 make use of the surface tension of the solvent to widen the width of the flow path and to prolong the staying time of the solvent, it is preferable that the opening diameter of the recesses of the liquid diffusion parts 5 and 54 or the width of the concentrically formed grooves is 0.8 mm or less, in some embodiments. For example, it is preferable to set the depth of the recesses to 1 mm or less, in some embodiments, in order to prevent the flow of the discharged liquid from being greatly hindered.

In addition, the liquid diffusion parts 5 and 54 may be provided on, for example, a vertical surface. For example, even in a configuration in which the liquid diffusion part 5 is provided on the inner surface of the cylindrical portion 22 of the upper cup body 3, it is possible to widen the flow path of the solvent flowing along the inner surface of the cylindrical portion 22. Thus, the same effect can be obtained. Since the vertical plane can be regarded as a plane inclined by 90 degrees with respect to the horizontal plane, it is assumed in this specification that the vertical plane is also included in the inclined plane.

Further, when the viscosity of the processing liquid is high, the solid component tends to precipitate with ease. Therefore, in the present disclosure, it is possible to obtain a great effect by applying the present disclosure to a liquid processing apparatus in which a processing liquid having a viscosity of 50 cP or more is supplied to a substrate. The solvent may be a solvent that dissolves a solid component of a processing liquid, for example, a thinner or the like.

In the above-described embodiment, the cleaning step of the cup body 2 is performed. However, for example, by performing the step of coating the resist film on the wafer W by increasing the supply amount of the solvent in the pre-wet process, the solvent may be supplied to the liquid diffusion part 5.

Further, the present disclosure may be applied to, for example, a developing device, a cleaning device or the like. Moreover, the present disclosure may be applied to an adhesive coating device for coating an adhesive for bonding a substrate to a substrate, or the like. In addition, for example, in a wet etching process, a cleaning process or the like, a reaction product generated by, for example, an acid alkali reaction or the like may adhere to an exhaust path. The present disclosure may also be applied to the removal of such a reaction product.

In addition, for example, in a liquid processing apparatus that performs a process of not supplying a solvent for dissolving a solid component of a processing liquid toward a wafer W, by providing a nozzle similar to the above-described auxiliary nozzle 9, the solvent can be held in the liquid diffusion part 5. Thus, the same effect can be obtained.

Further, the solvent supply part for supplying the solvent may be a back surface cleaning nozzle for cleaning a back surface of a substrate. For example, after the resist liquid is coated on the wafer W, a solvent is supplied toward the peripheral edge of the back surface of the wafer W to clean the peripheral edge of the back surface of the wafer W. At this time, the solvent supplied to the peripheral edge of the back surface flows inside the cup body 2 and is supplied to the liquid diffusion part 5. Thus, the same effect can be obtained.

As the mesh, a fibrous member such as a nonwoven fabric or the like may be used. Unevenness is formed on the surface of the nonwoven fabric by the openings of the fibers constituting the nonwoven fabric. Therefore, it is possible to hold the solvent. Further, since the solvent can spread between the openings of the fibers by the capillary phenomenon due to the surface tension of the solvent, it possible to widen the flow path of the solvent. Accordingly, it is possible to obtain the same effect as in the case of applying the mesh 51.

In addition, a liquid diffusion part may be provided in a drainage path for draining a processing liquid, for example, on a bottom surface of a drainage flow path of the drainage case 7 shown in FIG. 3. By doing so, when the solvent flowing into the drainage port 27 flows through the drainage case 7, the flow path is widened and the staying time of the solvent is prolonged. This makes it possible to suppress adhesion of a solid component of a processing liquid in the drainage case 7.

[Verification Test]

In order to verify the effect of the embodiment of the present disclosure, the spread of a liquid droplet by providing the mesh was tested.

In Test Example 1, a mesh having a wire diameter of 0.22 mm and an opening size of 0.5 mm was provided on the upper surface of a rectangular stainless steel plate, and the spreading size of a liquid droplet when 1 cc of a solvent (OK73) is dropped toward the mesh was evaluated. Furthermore, the spreading size of a liquid droplet when 1 cc of cyclohexanone (CHN) is dropped as a solvent toward the mesh was evaluated.

In Test Example 2, a process was performed in the same manner as in Test Example 1 except that a mesh having a wire diameter of 0.04 mm and an opening size of 0.087 mm is used.

In a Comparative Example, a mesh was not provided, 1 cc of a solvent (OK73) was dropped on an upper surface of a stainless steel plate, and 1 cc of cyclohexanone (CHN) was dropped.

In each of Test Examples 1 and 2 and the Comparative Example, the length L1 of the spreading droplet in the longitudinal direction of the stainless steel plate and the length L2 of the spreading droplet in the direction perpendicular to the length L1 were measured to evaluate the spreading size of the droplet. Table 1 shows the result and indicates the length L1 and the length L2 as the spreading size of the droplet when each solvent is dropped in each of Test Examples 1 and 2 and the Comparative Example.

TABLE 1

|  |  | Length L1 (mm) | Length L2 (mm) |
|---|---|---|---|
| Test Example 1 | OK73 | 50 | 70 |
|  | CHN | 35 | 55 |
| Test Example 2 | OK73 | 85 | 55 |
|  | CHN | 50 | 70 |
| Comparative Example | OK73 | 40 | 35 |
|  | CHN | 40 | 35 |

In the Comparative Example, the spreading size of the droplet in OK73 was 40 mm in length L1 and 35 mm in length L2. The spreading size of the droplet in CHN was 40 mm in length L1 and 35 mm in length L2.

In Test Example 1, the spreading size of the droplet in OK73 was 50 mm in length L1 and 70 mm in length L2. The spreading size of the droplet in CHN was 35 mm in length L1 and 55 mm in length L2.

In Test Example 2, the spreading size of the droplet in OK73 was 85 mm in length L1 and 55 mm in length L2. The spreading size of the droplet in CHN was 50 mm in length L1 and 70 mm in length L2.

According to the result, it can be noted that the spreading size of the droplet is larger in both Test Example 1 and Test Example 2 than in the Comparative Example. Accordingly, it can be said that by providing the mesh, the droplet can be greatly spread by the capillary phenomenon utilizing surface tension.

In Test Example 3, a process was performed on 25 wafers W using the resist coating apparatus shown in FIGS. 1 to 4 except that no mesh is provided.

In Test Example 4, the same process as in Test Example 3 was performed except that the mesh described in the embodiment are cut into a size of 90 mm×65 mm and six meshes thus cut are arranged on the inclined surface inside the cup body in the circumferential direction.

For Test Example 3, the exhaust pressure in the exhaust path was measured before the start of the processing of the wafers W and after the end of the processing of 6, 10, 14, 18 and 25 wafers W.

Figure 12:
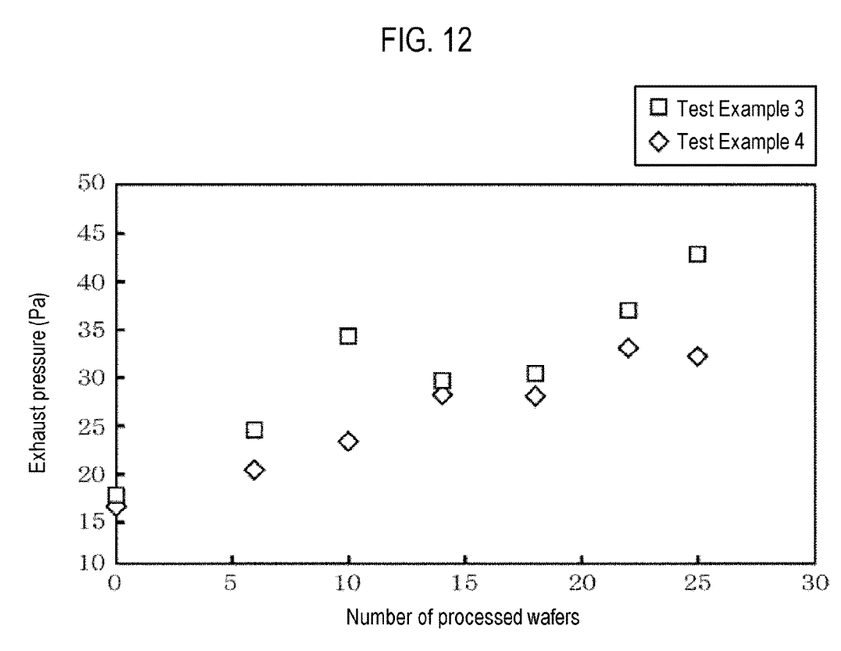
FIG. 12 is a characteristic diagram showing variations in exhaust pressure in Test Example 3 and Test Example 4.

For Test Example 4, the exhaust pressure in the merging duct 62 of the exhaust duct 6 was measured before the start of the processing of the wafers W and after the end of the processing of 6, 10, 14, 18, 22 and 25 wafers W. FIG. 12 shows the result and is a characteristic diagram showing the number of processed wafers W and the exhaust pressure in the exhaust path in each of Test Example 3 and Test Example 4.

As shown in FIG. 12, it can be noted that the rise in the exhaust pressure is smaller in Test Example 4 than in Test Example 3. In addition, for each of Test Example 3 and Test Example 4, the state inside the cup body 2 after the processing of 25 wafers W was observed. In Test Example 3, an adhered substance was widely observed on the entire surface of the cup body 2. However, in Test Example 4, a portion with less adhered substance was observed around the upper side of the mesh.

According to this result, it is presumed that by providing the mesh in the cup body 2, the solvent easily stays on the bottom surface of the cup body 2 and the adhesion of the adhered substance can be suppressed. Therefore, the solid component flowing into the exhaust duct 6 decreases, and the adhesion of the solid component in the exhaust duct 6 decreases. Thus, it is presumed that the rise of the exhaust pressure in the exhaust duct 6 is suppressed.

According to the present disclosure, in a liquid processing apparatus provided with a cup body for draining a processing liquid scattered by the rotation of a substrate, in which a process is performed by supplying a processing liquid to a rotating substrate, liquid diffusion parts each having a concavo-convex pattern are provided along the inner surface of an exhaust path inside the cup body and inside an exhaust path member, through which the atmosphere around the substrate is exhausted. Therefore, when a solvent for dissolving the solid component generated from the processing liquid is supplied toward the liquid diffusion part, the flow region of the solvent is easily expanded due to a capillary phenomenon. Thus, the solid component generated from the processing liquid is easily dissolved and removed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A liquid processing apparatus, comprising:
    a substrate holding part configured to hold a substrate horizontally and rotate the substrate around a vertical axis;
    a processing liquid supply part configured to supply a processing liquid to the substrate held by the substrate holding part;
    a cup body provided so as to surround the substrate on the substrate holding part and configured to drain the processing liquid scattered by a rotation of the substrate;
    a solvent supply part configured to supply a solvent for dissolving a solid component generated from the processing liquid;
    an exhaust path member having an exhaust port opened inside the cup body, and configured to exhaust an atmosphere around the substrate held by the substrate holding part through the cup body; and
    a liquid diffusion part having a concavo-convex pattern and provided on an inner surface of an exhaust path so that the solvent supplied from the solvent supply part is spread by a capillary phenomenon inside the exhaust path through which the atmosphere around the substrate is exhausted, the exhaust path being formed inside the cup body and the exhaust path member.

2. The apparatus of claim 1, wherein the liquid diffusion part is provided on an inner surface of the exhaust path in the cup body.

3. The apparatus of claim 2, wherein the solvent supply part is a solvent nozzle configured to supply the solvent to the substrate held by the substrate holding part.

4. The apparatus of claim 1, wherein the liquid diffusion part is provided on an inner surface of the exhaust path in the exhaust path member, and the solvent supply part is a solvent nozzle configured to supply the solvent to an inner surface of the exhaust path member.

5. The apparatus of claim 1, wherein an inner surface of a portion where the liquid diffusion part is provided is an inclined surface.

6. The apparatus of claim 1, wherein the concavo-convex pattern is a pattern in which unevenness is formed in a mesh shape or in a shape of a plurality of grooves.

7. The apparatus of claim 1, wherein the liquid diffusion part includes a planar body having the concavo-convex pattern formed on a surface thereof and capable of being attached to and detached from an inner surface of a portion to which a solid component adheres.

8. The apparatus of claim 7, wherein the planar body is a mesh body.

9. The apparatus of claim 1, wherein the concavo-convex pattern is a pattern formed by blasting.

* * * * *